US011581479B2

(12) United States Patent
Shimura et al.

(10) Patent No.: US 11,581,479 B2
(45) Date of Patent: Feb. 14, 2023

(54) PIEZOELECTRIC ELEMENT

(71) Applicant: TDK CORPORATION, Tokyo (JP)

(72) Inventors: Yoshikazu Shimura, Tokyo (JP); Kaoru Kijima, Tokyo (JP); Hideya Sakamoto, Tokyo (JP); Kazushi Tachimoto, Tokyo (JP); Ryuhei Sasaki, Tokyo (JP); Yoshiki Ohta, Tokyo (JP); Akihiro Takeda, Tokyo (JP)

(73) Assignee: TDK CORPORATION, Tokyo (JP)

( * ) Notice: Subject to any disclaimer, the term of this patent is extended or adjusted under 35 U.S.C. 154(b) by 294 days.

(21) Appl. No.: 16/957,191

(22) PCT Filed: Dec. 12, 2018

(86) PCT No.: PCT/JP2018/045707
§ 371 (c)(1),
(2) Date: Jun. 23, 2020

(87) PCT Pub. No.: WO2019/131135
PCT Pub. Date: Jul. 4, 2019

(65) Prior Publication Data
US 2020/0321513 A1  Oct. 8, 2020

(30) Foreign Application Priority Data
Dec. 28, 2017  (JP) .............................. JP2017-254905

(51) Int. Cl.
*H01L 41/083* (2006.01)
*H01L 41/047* (2006.01)

(52) U.S. Cl.
CPC ...... *H01L 41/0838* (2013.01); *H01L 41/0471* (2013.01); *H01L 41/0474* (2013.01)

(58) Field of Classification Search
CPC ............. H01L 41/0838; H01L 41/0471; H01L 41/0474; H01L 41/0926; H04R 17/00
See application file for complete search history.

(56) References Cited

U.S. PATENT DOCUMENTS

| 2007/0084034 A1 | 4/2007 | Omura et al. |
| 2009/0152999 A1 | 6/2009 | Omura et al. |

(Continued)

FOREIGN PATENT DOCUMENTS

| CN | 103959816 A | 7/2014 |
| JP | 2002112391 | * 4/2002 |

(Continued)

OTHER PUBLICATIONS

Jun. 30, 2020 International Preliminary Report on Patentability issued in International Patent Application No. PCT/JP2018/045707.

(Continued)

*Primary Examiner* — Matthew L Reames
(74) *Attorney, Agent, or Firm* — Oliff PLC

(57) ABSTRACT

In a piezoelectric element, shift of a resonance point to a low-pitched sound side is achieved. A resonance point of a piezoelectric element moves to a low-pitched sound side when an active region is configured to be surrounded by an inactive region as in the configuration of the piezoelectric element. According to the piezoelectric element whose resonance point is moved to a low-pitched sound side, the piezoelectric element can realize a sound pressure that is sufficiently high for practical use when it is applied to an acoustic device.

7 Claims, 9 Drawing Sheets

(56) References Cited

U.S. PATENT DOCUMENTS

2014/0319968 A1    10/2014  Sashida et al.
2015/0255704 A1*   9/2015   Kim .................... H01L 41/1876
                                                            310/321

FOREIGN PATENT DOCUMENTS

| JP | 2015-046947 A | 3/2015 |
| JP | 2015-122438 A | 7/2015 |
| WO | 2006/073018 A1 | 7/2006 |

OTHER PUBLICATIONS

Mar. 12, 2019 International Search Report issued in International Patent Application No. PCT/JP2018/045707.

* cited by examiner (a)

(b)

PIEZOELECTRIC ELEMENT

CROSS-REFERENCE TO RELATED APPLICATIONS

This application is a 35 U.S.C. § 371 national phase application of PCT/JP2018/045707, filed on Dec. 12, 2018, which claims priority to Japanese Patent Application No. 2017-254905, filed on Dec. 28, 2017.

TECHNICAL FIELD

The disclosure relates to a piezoelectric element.

BACKGROUND ART

Conventionally, a piezoelectric element of a bimorph type which can obtain displacement that is larger than that of a unimorph type is known. Patent Literature 1 below discloses a technology in which a piezoelectric element of a bimorph type is applied to an acoustic device.

CITATION LIST

Patent Literature

[Patent Literature 1] Japanese Unexamined Patent Publication No. 2002-112391

SUMMARY OF INVENTION

Technical Problem

As a result of repeated research on a sound pressure when piezoelectric elements of a bimorph type are applied to acoustic devices, the inventors have found that an acoustic device with a high sound pressure can be realized when a resonance point of the piezoelectric element is moved to a low-pitched sound side. Therefore, after further research, they newly found a technology for shifting a resonance point of the piezoelectric element to a low-pitched sound side.

An objective of the disclosure is to provide a piezoelectric element in which a shift of a resonance point to a low-pitched sound side is achieved.

Solution to Problem

A piezoelectric element according to one aspect of the disclosure includes an element body made of a piezoelectric material and including a plurality of internal electrodes disposed to be laminated, and a plurality of external electrodes formed on a surface of the element body and electrically connected to the plurality of internal electrodes, in which the element body includes an active region which is a region sandwiched between the plurality of internal electrodes and expands and contracts when a voltage is applied between the plurality of external electrodes, and an inactive region which does not vibrate when a voltage is applied between the plurality of external electrodes, the active region includes a first active region and a second active region which are adjacent to each other in a lamination direction of the plurality of internal electrodes and expand and contract in directions opposite to each other when a voltage is applied between the plurality of external electrodes, and the inactive region surrounds the active region.

In the piezoelectric element described above, a bimorph structure is formed by the first active region and the second active region expanding and contracting in directions opposite to each other. Since the active region including the first active region and the second active region is surrounded by the inactive region, a resonance point of the piezoelectric element is moved to a low-pitched sound side. Therefore, when the above-described piezoelectric element is applied to an acoustic device, a sound pressure that is sufficiently high for practical use can be obtained.

In the piezoelectric element according to another aspect, the plurality of internal electrodes include a first internal electrode positioned between the first active region and the second active region in the lamination direction, a second internal electrode sandwiching the first active region between the first internal electrode and the second internal electrode, and a third internal electrode sandwiching the second active region between the first internal electrode and the third internal electrode.

In the piezoelectric element according to another aspect, the element body includes a pair of main surfaces facing each other in the lamination direction, and a side surface connecting the pair of main surfaces, and end portions of the plurality of internal electrodes are exposed on the side surface and electrically connected to the external electrodes provided on the side surface. In this case, the internal electrodes are extracted from the side surface of the element body to the outside of the element body and are connected to the external electrodes on the side surface.

The piezoelectric element according to another aspect further includes a metal layer disposed in the inactive region. In this case, occurrence of cracking at the time of manufacturing or driving can be suppressed.

In the piezoelectric element according to another aspect, the metal layer is electrically connected to the external electrode. In this case, reinforcement of the piezoelectric element can be achieved.

In the piezoelectric element according to another aspect, a density of an electrode component in the metal layer is lower than a density of an electrode component in the internal electrode. In this case, a situation in which the metal layer hinders displacement of the piezoelectric element more than necessary is suppressed.

In the piezoelectric element according to another aspect, the element body includes a pair of main surfaces facing each other in the lamination direction, and a side surface connecting the pair of main surfaces, and the plurality of internal electrodes are extracted to the main surface via a plurality of through-hole conductors extending in the lamination direction and electrically connected to the external electrodes provided on the main surface. In this case, the internal electrodes are extracted from the main surface of the element body to the outside of the element body and are connected to the external electrodes on the main surface.

In the piezoelectric element according to another aspect, the plurality of through-hole conductors are positioned to be biased to a region close to the side surface, and a maximum displacement region of the active region is deviated from a center of the element body when viewed from the lamination direction.

In the piezoelectric element according to another aspect, a distance from the main surface of the element body to the active region is smaller than a distance from the side surface of the element body to the active region.

Advantageous Effects of Invention

According to the disclosure, a piezoelectric element in which a shift of a resonance point to a low-pitched sound side is achieved is provided.

DESCRIPTION OF EMBODIMENTS

Hereinafter, an embodiment for implementing the disclosure will be described in detail with reference to the accompanying drawings. Further, the same or equivalent elements are denoted by the same reference signs, and duplicate description will be omitted.

Figure 1:
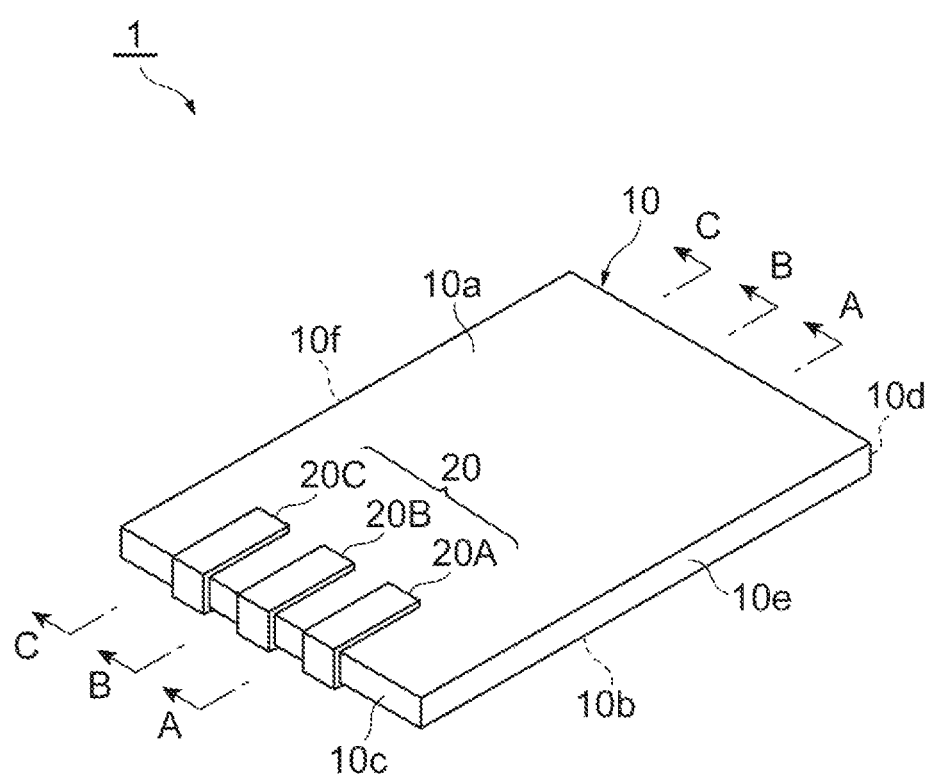
FIG. 1 is a schematic perspective view illustrating a piezoelectric element according to an embodiment.

As illustrated in FIG. 1, a piezoelectric element 1 according to the embodiment is configured to include an element body 10 made of a piezoelectric material and an external electrode 20 formed on a surface of the element body 10.

The element body 10 has a rectangular flat plate-like outer shape and includes a pair of main surfaces 10a and 10b and four side surfaces 10c to 10f. The four side surfaces 10c to 10f connect the pair of main surfaces 10a and 10b to each other, the side surfaces 10c and 10d face each other in a long-side direction of the element body, and the side surfaces 10e and 10f face each other in a short-side direction of the element body.

The external electrode 20 is configured of three external electrodes 20A, 20B, and 20C. All the three external electrodes 20A, 20B, and 20C are provided on the side surface 10c of the element body 10. More specifically, each of the external electrodes 20A, 20B, 20C covers the side surface 10c and continuously extends from the side surface 10c to the main surfaces 10a and 10b to cover a part of the main surfaces 10a and 10b.

Figure 2:
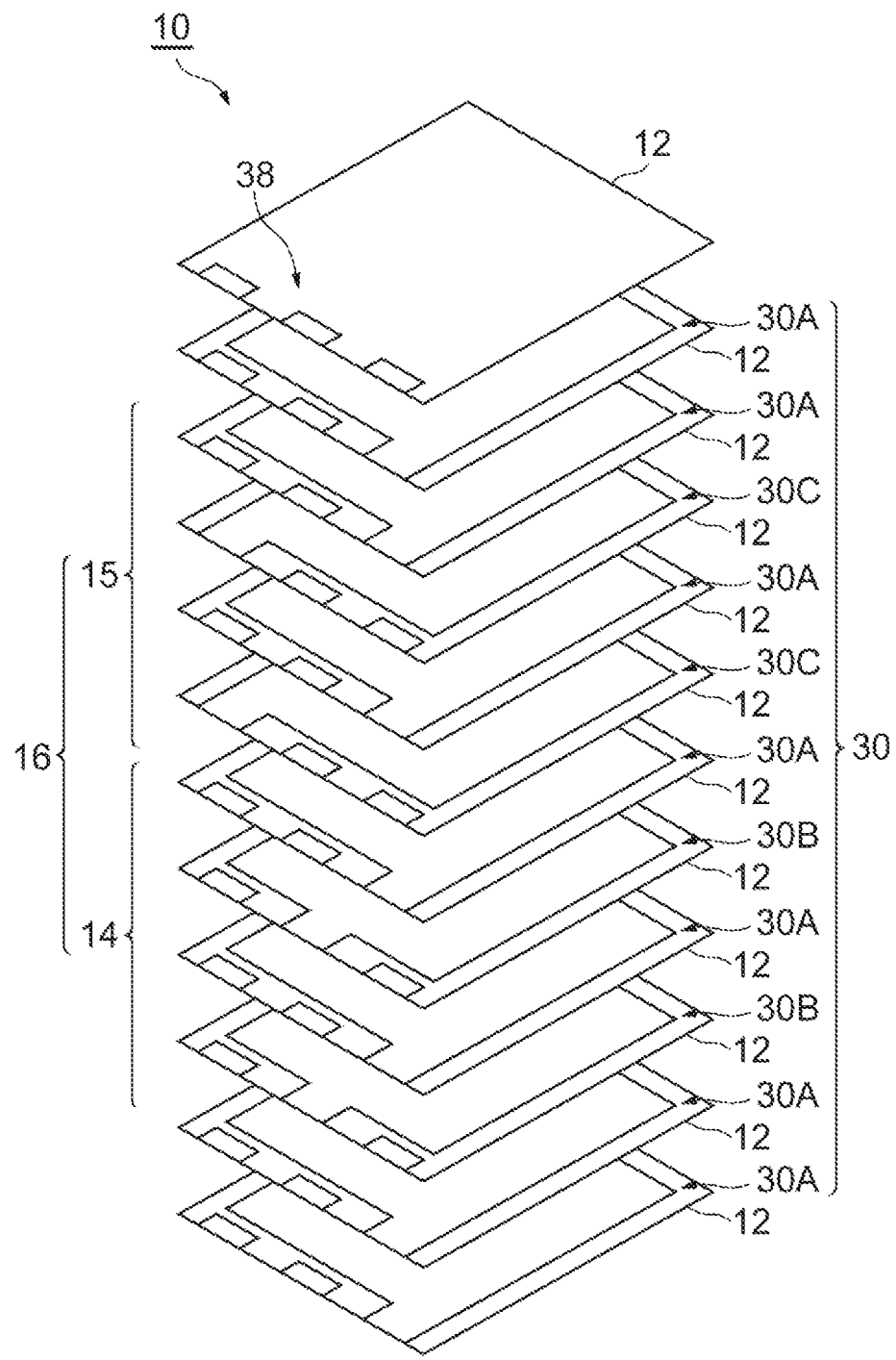
FIG. 2 is an exploded perspective view of an element body of the piezoelectric element illustrated in FIG. 1.

The element body 10 of the piezoelectric element 1 has a laminated structure as illustrated in FIG. 2, and a plurality of piezoelectric layers 12 and a plurality of electrode layers 30 are alternately laminated. In the present embodiment, the element body 10 includes 12 piezoelectric layers 12 and 11 electrode layers 30. The main surface 10a of the element body 10 is formed on an upper surface of the piezoelectric layers 12 at an uppermost layer, the main surface 10b is formed on a lower surface of the piezoelectric layers 12 at a lowermost layer, and the main surfaces 10a and 10b face each other in a lamination direction.

The piezoelectric layers 12 are each made of a piezoelectric material, and in the present embodiment, made of a piezoelectric ceramic material.

The electrode layers 30 are each made of Ag or a Ag alloy. The electrode layers 30 are classified into three types of electrode layers 30A, 30B, and 30C according to patterning shapes thereof. Any one of the three types of the electrode layers 30A, 30B, and 30C is formed on each of the piezoelectric layers 12.

Figure 3:
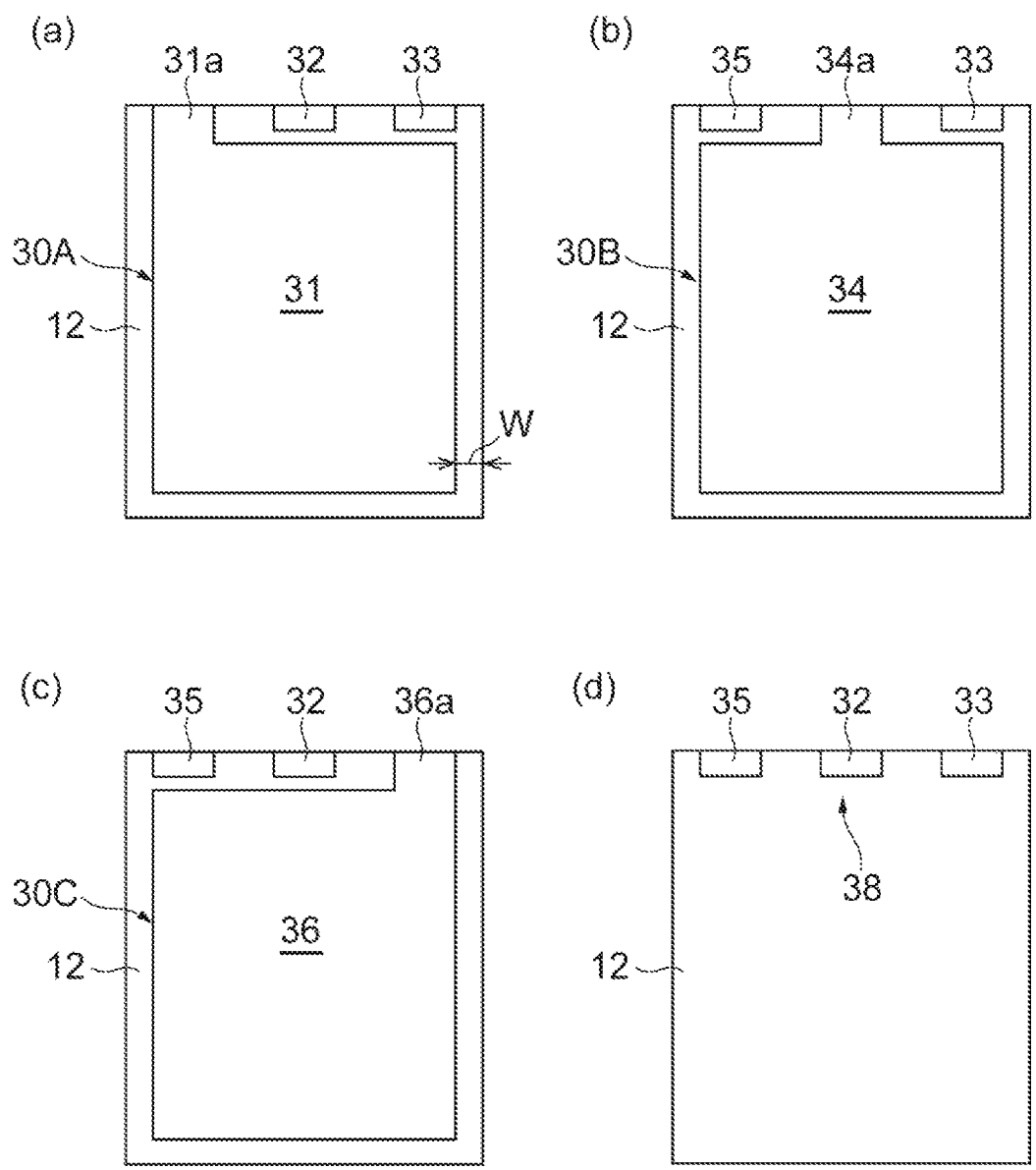
FIG. 3 is a plan view in which configurations of each internal electrode illustrated in FIG. 2 are illustrated.

As illustrated in FIG. 3(a), the electrode layer 30A includes a first internal electrode 31 covering substantially an entire region of the piezoelectric layer 12, and two metal layers 32 and 33 disposed along a short side of the piezoelectric layer 12 corresponding to the side surface 10c of the element body 10. The first internal electrode 31 includes a draw-out portion 31a that is extracted to the short side of the piezoelectric layer 12 corresponding to the side surface 10c of the element body 10, but is separated from the other sides by a predetermined width W. The first internal electrode 31 is extracted to a position at which the external electrode 20A provided on the side surface 10c of the element body 10 is formed and is electrically connected to the external electrode 20A in the draw-out portion 31a at an end portion. The metal layer 32 is extracted to a position at which the external electrode 20B provided on the side surface 10c of the element body 10 is formed and is electrically connected to the external electrode 20B. The metal layer 33 is extracted to a position at which the external electrode 20C provided on the side surface 10c of the element body 10 is formed and is electrically connected to the external electrode 20C.

As illustrated in FIG. 3(b), the electrode layer 30B includes a second internal electrode 34 covering substantially an entire region of the piezoelectric layer 12, and two metal layers 33 and 35 disposed along the short side of the piezoelectric layer 12 corresponding to the side surface 10c of the element body 10. Similarly to the first internal electrode 31, the second internal electrode 34 includes a draw-out portion 34a that is extracted to the short side of the piezoelectric layer 12 corresponding to the side surface 10c of the element body 10, but is separated from the other sides by the predetermined width W. The second internal electrode 34 is extracted to the position at which the external electrode 20B provided on the side surface 10c of the element body 10 is formed and is electrically connected to the external electrode 20B in the draw-out portion 34a at an end portion. The metal layer 35 is extracted to the position at which the external electrode 20A provided on the side surface 10c of the element body 10 is formed and is electrically connected to the external electrode 20A. The metal layer 33 is extracted to the position at which the external electrode 20C provided on the side surface 10c of the element body 10 is formed and is electrically connected to the external electrode 20C.

As illustrated in FIG. 3(c), the electrode layer 30C includes a third internal electrode 36 covering substantially an entire region of the piezoelectric layer 12, and two metal layers 32 and 35 disposed along the short side of the piezoelectric layer 12 corresponding to the side surface 10c of the element body 10. Similarly to the first internal electrode 31 and the second internal electrode 34, the third internal electrode 36 includes a draw-out portion 36a that is extracted to the short side of the piezoelectric layer 12 corresponding to the side surface 10c of the element body 10, but is separated from the other sides by the predetermined width W. The third internal electrode 36 is extracted to the position at which the external electrode 20C provided on the side surface 10c of the element body 10 is formed and is electrically connected to the external electrode 20C in the draw-out portion 36a at an end portion. The metal layer 35 is extracted to the position at which the external electrode 20A provided on the side surface 10c of the element body 10 is formed and is electrically connected to the external electrode 20A. The metal layer 32 is extracted to the position at which the external electrode 20B provided on the side surface 10c of the element body 10 is formed and is electrically connected to the external electrode NB.

Further, as illustrated in FIG. 3(d), a terminal electrode 38 formed in a position and shape corresponding to the above-described metal layers 32, 33, and 35 is provided on the piezoelectric layer 12 at the uppermost layer of the piezoelectric element 1. The metal layers 32, 33, and 35 of the terminal electrode 38 are electrically connected to the corresponding external electrodes 20A, 20B, and 20C. Further, the terminal electrode 38 of the piezoelectric layer 12 at the uppermost layer can be appropriately omitted.

Next, a lamination order of the electrode layers 30A, 30B, and 30C will be described with reference to FIG. 2.

The electrode layer 30A (hereinafter, also referred to as a central electrode layer) is positioned near a center (seventh layer from the top in FIG. 2) in the lamination direction of the element body 10, the electrode layers 30A and the electrode layers 30B are alternately aligned below the central electrode layer 30A, and the electrode layers 30A and the electrode layers 30C are alternately aligned above the central electrode layer 30A. More specifically, the electrode layer 30B, the electrode layer 30A, the electrode layer 30B, and the electrode layer 30A are aligned in that order below the central electrode layer 30A, and the electrode layer 30A is further disposed on a lower side thereof. Also, the electrode layer 30C, the electrode layer 30A, the electrode layer 30C, and the electrode layer 30A are aligned in that order above the central electrode layer 30A, and the electrode layer 30A is further disposed on an upper side thereof.

Figure 4:
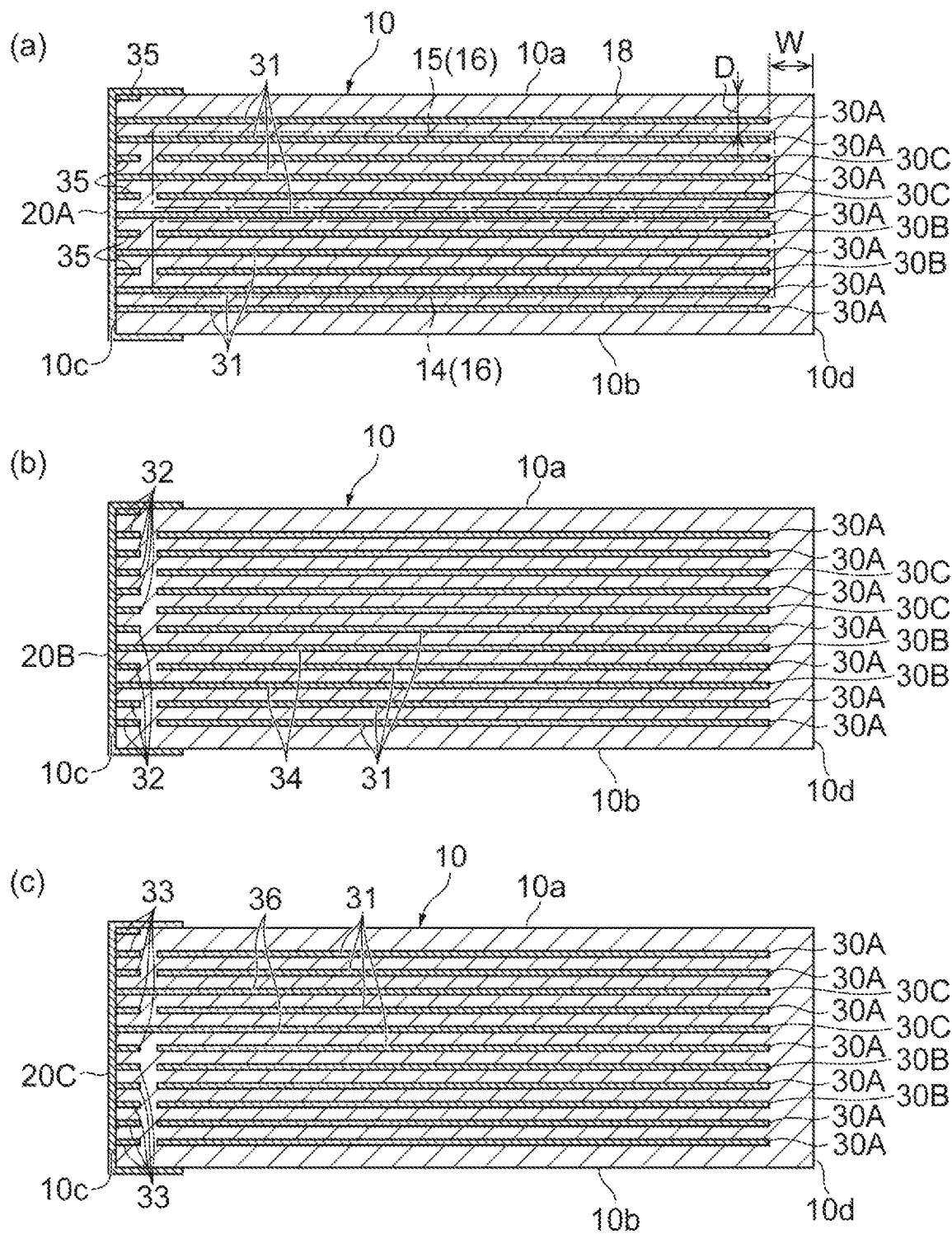
FIG. 4 is a cross-sectional view illustrating the piezoelectric element illustrated in FIG. 1.

FIG. 4(a) illustrates a cross section of the piezoelectric element 1 of FIG. 1 along line A-A, FIG. 4(b) illustrates a cross section along line B-B, and FIG. 4(c) illustrates a cross section along line C-C.

As illustrated in FIG. 4(a), in the element body 10, a region sandwiched between the first internal electrode 31 of the electrode layer 30A and the second internal electrode 34 of the electrode layer 30B below the central electrode layer 30A forms a first active region 14. Also, a region sandwiched between the first internal electrode 31 of the electrode layer 30A and the third internal electrode 36 of the electrode layer 30C above the central electrode layer 30A forms a second active region 15. The first active region 14 and the second active region 15 are adjacent to each other with the central electrode layer 30A interposed therebetween in the lamination direction.

That is, the element body 10 includes two active regions 14 and 15 as an active region 16. In the active region 16, when a voltage is applied between the external electrodes 20, the piezoelectric layers 12 expand and contract due to an electric field generated between the electrode layers 30. In the first active region 14, when a voltage is applied between the external electrode 20A and the external electrode 20B, the piezoelectric layer 12 of a portion sandwiched between the first internal electrode 31 of the electrode layer 30A and the second internal electrode 34 of the electrode layer 30B expands and contracts. In the second active region 15, when a voltage is applied between the external electrode 20A and the external electrode 20C, the piezoelectric layer 12 of a portion sandwiched between the first internal electrode 31 of the electrode layer 30A and the third internal electrode 36 of the electrode layer 30C expands and contracts.

The electrode layers 30 include the second internal electrode 34 of the electrode layer 30B that sandwiches the first active region 14 between the first internal electrode 31 of the central electrode layer 30A and the second internal electrode 34 of the electrode layer 30B, and the third internal electrode 36 of the electrode layer 30C that sandwiches the second active region 15 between the first internal electrode 31 of the central electrode layer 30A and the third internal electrode 36 of the electrode layer 30C.

In the present embodiment, the common external electrode 20A is utilized to apply a voltage to the first active region 14 and to apply a voltage to the second active region 15, and, for example, the external electrodes 20B and 20C are positive electrodes when the external electrode 20A is a negative electrode. Therefore, when a voltage is applied to the external electrodes 20B and 20C, electric fields in a direction opposite to the lamination direction are generated in the first active region 14 and the second active region 15, and expansion and contraction occur in directions opposite to each other in the first active region 14 and the second active region 15. As described above, the piezoelectric element 1 has an element structure of a bimorph type in which the first active region 14 and the second active region 15 that cause expansion and contraction in directions opposite to each other overlap in the lamination direction. Since the bimorph type can obtain a large displacement compared to a unimorph type, the bimorph type can realize a sufficient acoustic function when it is applied to an acoustic device. In the piezoelectric element 1, since the piezoelectric element 1 itself has an acoustic function, a vibrating plate or a support is not required when the piezoelectric element 1 is utilized as an acoustic device, and an acoustic function can be added to an external mounting member (flexible printed wiring board or the like) by simply mounting the piezoelectric element 1 directly on the member.

On the other hand, in the element body 10, a portion other than the active region 16 is an inactive region 18 in which the piezoelectric layer 12 does not expand or contract even when a voltage is applied between the external electrodes 20. In the element body 10, the inactive region 18 surrounds the active region 16. More specifically, the configuration is such that the inactive region 18 covers the active region 16 on the six surfaces 10a to 10f of the element body 10, and the active region 16 is housed in the inactive region 18. A thickness D of the inactive region 18 in the lamination direction (that is, a distance from the main surfaces 10a and 10b of the element body 10 to the active region 16) may be 50 μm as an example, a width W of the inactive region 18 in a plane perpendicular to the lamination direction (that is, a distance from the side surfaces 10c to 10f of the element body 10 to the active region 16) may be 800 μm as an example, and the thickness D of the inactive region 18 is smaller than the width W.

The inventors have newly found that a resonance point of the piezoelectric element 1 moves to a low-pitched sound side when the active region 16 is configured to be surrounded by the inactive region 18 as in the configuration of the piezoelectric element 1 described above. The piezoelectric element 1 whose resonance point is moved to a low-pitched sound side can realize a sound pressure that is sufficiently high for practical use when it is applied to an acoustic device.

In the piezoelectric element 1, since the electrode layers 30A to 30C include the metal layers 32, 33, and 35, the electrode layers 30A to 30C cover substantially entire areas of the piezoelectric layers 12. Therefore, distortion or stress concentration due to presence or absence of the electrodes is not easily generated, and occurrence of cracking at the time of manufacturing or driving is suppressed. Also, since the metal layers 32, 33, and 35 are connected to the corresponding external electrodes 20A to 20C, the metal layers 32, 33, and 35 have high strength and also have a function of reinforcing the element body 10. Thereby, an influence of an external force from an external mounting member on the active region 14 of the piezoelectric element 1 is reduced.

Further, since the metal layers 32, 33, and 35 are formed in regions overlapping the draw-out portions 31a, 34a, and 36a of the internal electrodes 31, 34, and 36 of the electrode layers 30 which vertically overlap, decrease in density of electrode components of the draw-out portions 31a, 34a, and 36a is suppressed. That is, in the draw-out portions 31a, 34a, and 36a of the internal electrodes 31, 34, and 36, although a part of the electrode components may be absorbed by the piezoelectric layers 12 positioned above and below in the lamination direction during a calcination process of the element body 10, when the metal layers 32, 33, and 35 are provided to overlap the draw-out portions 31a, 34a, and 36a via the piezoelectric layers 12, an amount of electrode components absorbed by the piezoelectric layers 12 is reduced (for example, halved) in the draw-out portions 31a, 34a, and 36a. At this time, since electrode components of the metal layers 32, 33, and 35 are also absorbed by the piezoelectric layers 12 positioned above and below in the lamination direction, densities of the electrode components of the metal layers 32, 33, and 35 are lower than densities of electrode components of the internal electrodes 31, 34, and 36 (excluding the draw-out portions 31a, 34a, and 36a). Since the densities of the electrode components of the metal layers 32, 33, and 35 are lower than the densities of the electrode components of the internal electrodes 31, 34, and 36, a situation in which the metal layers 32, 33, and 35 hinder displacement of the piezoelectric element 1 more than necessary is suppressed.

In the present embodiment, the first internal electrode 31 positioned in the inactive region 18 (that is, the first internal electrode 31 positioned in the uppermost layer and the first internal electrode 31 positioned in the lowermost layer) serves as a reinforcing layer and has a function of reinforcing the element body 10 similarly to the metal layers 32, 33, and 35 described above. Since the first internal electrode 31 positioned in the inactive region 18 has a large formation region compared to the metal layers 32, 33, and 35, the first internal electrode 31 can effectively reinforce the element body 10.

Also, in the present embodiment, the piezoelectric element 1 is mounted on an external mounting member from the main surface 10b side. When the piezoelectric element 1 is mounted on the external mounting member, a binding force from the external mounting member is applied to the main surface 10b which is a mounting surface. However, in the piezoelectric element 1, since the inactive region 18 is configured to be interposed between the main surface 10b and the first active region 14, the above-described binding force is less likely to hinder expansion and contraction of the first active region 14 compared to a configuration in which the active region is directly mounted on the external mounting member. Therefore, a sufficient amount of expansion and contraction can be obtained in the first active region 14, and a large displacement can be obtained in the entire piezoelectric element 1.

Figure 5:
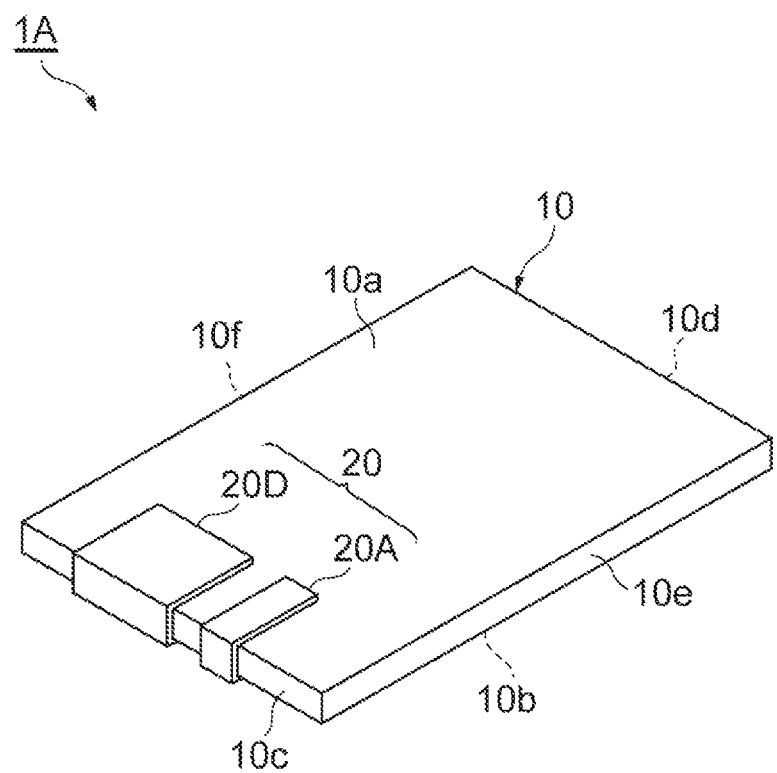
FIG. 5 is a schematic perspective view illustrating a piezoelectric element in an aspect different from that of FIG. 1.

Further, since the external electrodes 20B and 20C of the piezoelectric element 1 have the same polarity, they can be made as one external electrode. For example, in a piezoelectric element 1A illustrated in FIG. 5, two external electrodes 20A and 20D are provided on the side surface 10c of the element body 10. The external electrode 20D is provided to include the formation regions of both of the external electrodes 20B and 20C described above and is electrically connected to the internal electrodes 34 and 36 and the metal layers 32 and 33 on the side surface 10c. Even in such a piezoelectric element 1A, the same or similar effects as those in the piezoelectric element 1 described above are achieved.

Also, in the above-described embodiment, the piezoelectric element 1 in which the external electrode 20 is provided on the side surface 10c of the element body has been described, but it is also possible to use a piezoelectric element in which the external electrode is provided on the main surface.

Figure 6:
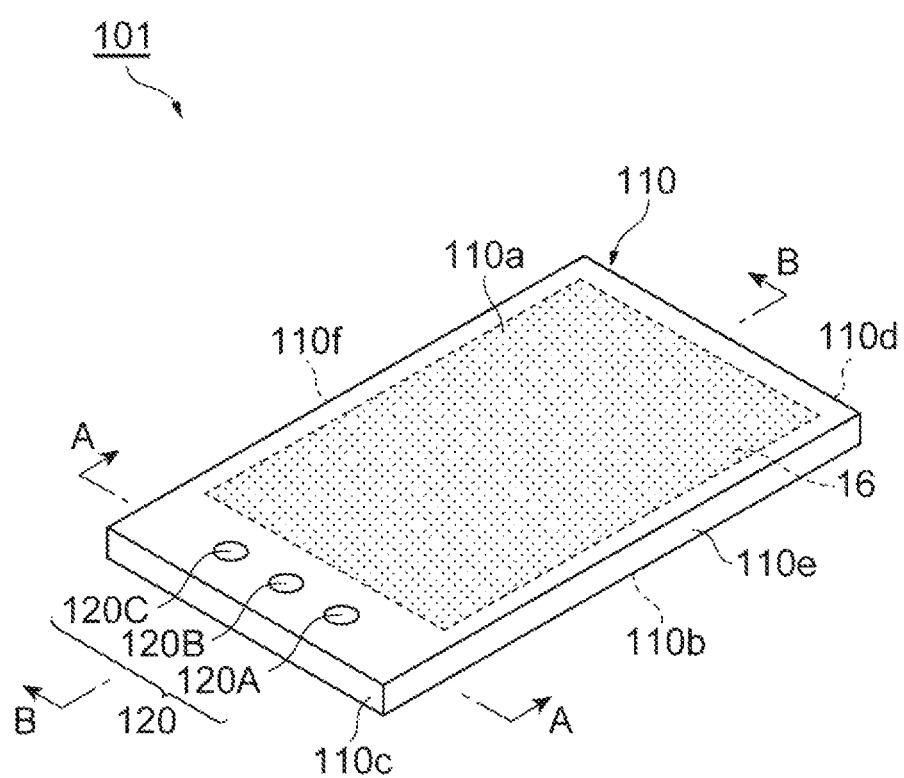
FIG. 6 is a schematic perspective view illustrating a piezoelectric element in an aspect different from that of FIG. 1
Figure 7:
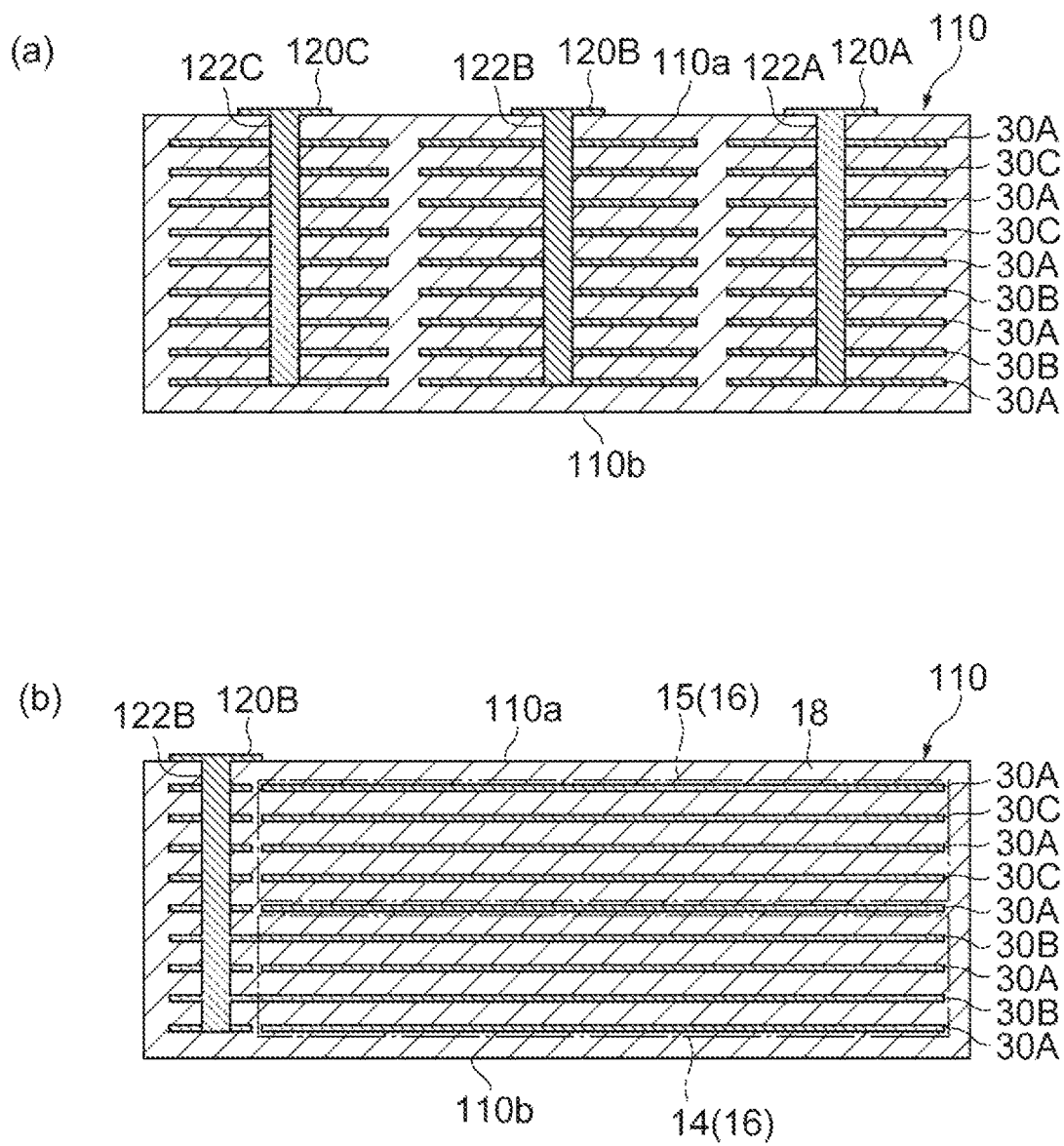
FIG. 7 is a cross-sectional view illustrating the piezoelectric element illustrated in FIG. 6.

Hereinafter, a piezoelectric element 101 in which an external electrode is provided on a main surface will be described with reference to FIGS. 6 and 7. FIG. 7(a) illustrates a cross section of the piezoelectric element 101 illustrated in FIG. 6 along line A-A, and FIG. 7(b) illustrates a cross section along line B-B.

The piezoelectric element 101 is configured to include an element body 110 made of a piezoelectric material and an external electrode 120 formed on a main surface of the element body 110. The element body 110 has substantially the same outer shape and laminated structure as the element body 10 of the piezoelectric element 1 described above. The external electrode 120 is formed of three external electrodes 120A, 120B, and 120C. All of the three external electrodes 120A, 120B, and 120C are provided on a main surface 110a of the element body 110 on a side surface 110c side, and more specifically, provided close to a short side of the main surface 110a corresponding to the side surface 110c to be aligned at equal intervals along the short side.

As illustrated in FIG. 7, through-hole conductors 122A, 122B, and 122C extend from the external electrodes 120A, 120B, and 120C toward the inside in a lamination direction of the element body 110.

The through-hole conductor 122A extends to penetrate formation regions of the draw-out portion 31a of the electrode layer 30A and the metal layers 35 of the electrode layers 30B and 30C formed in the element body 110. Also, the through-hole conductor 122B extends to penetrate formation regions of the draw-out portion 34a of the electrode layer 30B and the metal layers 32 of the electrode layers 30A and 30C formed in the element body 110. Further, the through-hole conductor 122C extends to penetrate formation regions of the draw-out portion 36a of the electrode layer 30C and the metal layers 33 of the electrode layers 30A and 30B formed in the element body 110. That is, the internal electrodes 31, 34, and 36 are extracted to the main surface 110a via the through-hole conductors 122A, 122B, and 122C and electrically connected to the external electrodes 120A, 120B, and 120B provided on the main surface 110a.

As in the piezoelectric element 1, the piezoelectric element 101 described above also has an element structure of a bimorph type in which the first active region 14 and the second active region 15 that cause expansion and contraction in directions opposite to each other overlap in the lamination direction. Also, in the element body 110 of the piezoelectric element 101, similarly to the element body 10 of the piezoelectric element 1 described above, a portion other than the active region 16 is the inactive region 18 in which the piezoelectric layer 12 does not expand or contract even when a voltage is applied between the external electrodes 120.

Therefore, as in the piezoelectric element 1, the piezoelectric element 101 can achieve a shift of the resonance point to the low-pitched sound side and realize a sound pressure that is sufficiently high for practical use when it is applied to an acoustic device.

Figure 8:
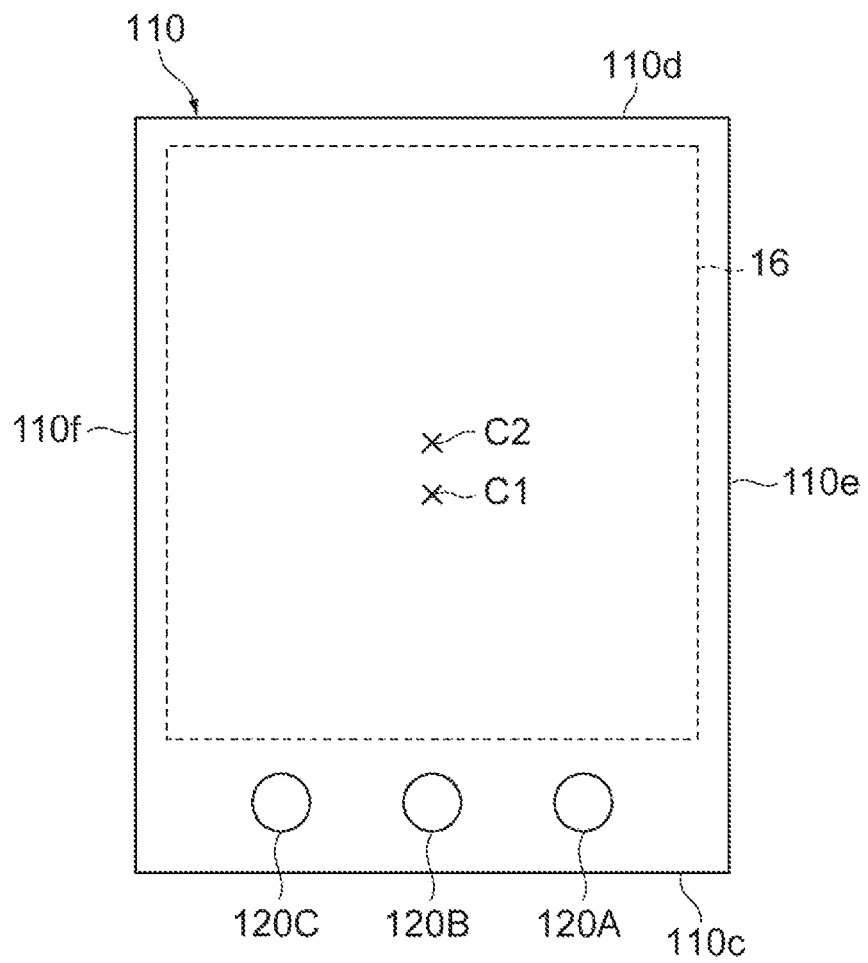
FIG. 8 is a plan view of the piezoelectric element illustrated in FIG. 6.

In the piezoelectric element 101, since the external electrodes 120A, 120B, and 120C and the through-hole conductors 122A, 122B, and 122C are positioned to be biased to a region close to the side surface 110c of the element body 110, the active region 16 is biased to a side surface 110d side. More specifically, as illustrated in FIG. 8, a maximum displacement region C2 of the active region 16 is deviated from a center C1 of the outer shape of the element body 110 toward the side surface 110d side when viewed from the lamination direction.

Figure 9:
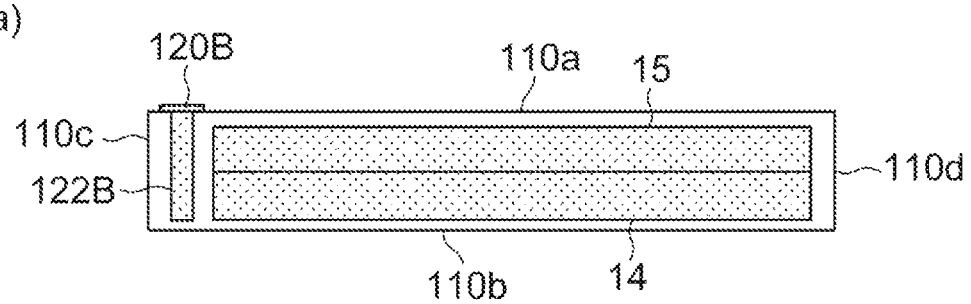
FIG. 9 is a view illustrating a variation in a degree of polarization of the piezoelectric element.
Figure 9:
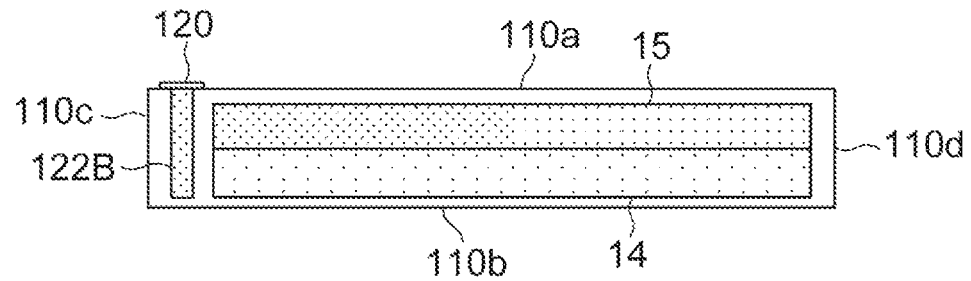

Here, in the piezoelectric element 101, since the external electrode 120 is provided on the main surface 110a, the piezoelectric element 101 can be mounted on an external mounting member from the main surface 110b side which is an opposite side thereof. At this time, it is desirable that the first active region 14 and the second active region 15 in the piezoelectric element 101 have a uniform degree of polarization throughout as illustrated in FIG. 9(*a*). In FIG. 9, a degree of polarization is illustrated using a density of dots. However, since an external force such as a binding force from the external mounting member is applied to the piezoelectric element 101 after the piezoelectric element 101 is mounted on the external mounting member, a degree of polarization in the first active region 14 and the second active region 15 may gradually decrease locally.

As an example, FIG. 9(*b*) illustrates a state in which a degree of polarization in the first active region 14 and the second active region 15 is locally decreased in the piezoelectric element 101. In FIG. 9(*b*), a degree of polarization of the first active region 14 is lower than that of the second active region 15, and in the second active region 15, a degree of polarization in a portion on the side surface 110d side is lower than that in a portion on the side surface 110c side. For example, when a degree of polarization in the portion on the side surface 110c side of the second active region 15 is assumed to be 100%, a degree of polarization in the portion on the side surface 110d side of the second active region 15 is decreased to 90%, and a degree of polarization of the first active region 14 is decreased to 80%.

In the piezoelectric element 101, the maximum displacement region C2 of the active region 16 is deviated from the center C1 of the outer shape of the element body 110 toward the side surface 110d side, and thereby variations in the degree of polarization of the active region 16 can be suppressed as illustrated in FIG. 9(*b*).

Further, the disclosure is not limited to the above-described embodiment and various modified forms can be employed. For example, the numbers of piezoelectric layers and electrode layers can be appropriately increased or decreased. Also, electrode patterns on each electrode layer can be appropriately changed.

REFERENCE SIGNS LIST

1, 101 Piezoelectric element
10, 110 Element body
12 Piezoelectric layer
14 First active region
15 Second active region
16 Active region
18 Inactive region
20, 20A, 20B, 20C, 120, 120A, 120B, 120C External electrode
30 Electrode layer
31, 34, 36 Internal electrode
122A, 122B, 122C Through-hole conductor

The invention claimed is:

1. A piezoelectric element comprising:
an element body made of a piezoelectric material and including a plurality of internal electrodes disposed to be laminated; and
a plurality of external electrodes formed on a surface of the element body and electrically connected to the plurality of internal electrodes,
wherein:
the element body includes:
an active region sandwiched between the plurality of internal electrodes, the active region expanding and contracting when a voltage is applied between the plurality of external electrodes; and
an inactive region not vibrating when a voltage is applied between the plurality of external electrodes,
the active region includes a first active region and a second active region adjacent to each other in a lamination direction of the plurality of internal electrodes, the first active region and the second active region expanding and contracting in directions opposite to each other when a voltage is applied between the plurality of external electrodes, and
the inactive region surrounds the active region,
wherein the element body further includes:
a pair of main surfaces facing each other in the lamination direction; and
a side surface connecting the pair of main surfaces, and end portions of the plurality of internal electrodes are exposed only on the side surface and electrically connected to the external electrodes which are provided on the side surface, and
the plurality of internal electrodes includes a first internal electrode positioned between the first active region and the second active region in the lamination direction, a second internal electrode sandwiching the first active region between the first internal electrode and the second internal electrode, and a third internal electrode sandwiching the second active region between the first internal electrode and the third internal electrode.

2. The piezoelectric element according to claim 1 further comprising a metal layer disposed in the inactive region.

3. The piezoelectric element according to claim 2, wherein the metal layer is electrically connected to the external electrode.

4. The piezoelectric element according to claim 2, wherein a density of an electrode component in the metal layer is lower than a density of an electrode component in an internal electrode of the plurality of internal electrodes.

5. The piezoelectric element according to claim 1, wherein:
the plurality of internal electrodes are extracted only to one of the main surfaces via a plurality of through-hole conductors extending in the lamination direction and electrically connected to the external electrodes which are provided on the one main surface.

6. The piezoelectric element according to claim 5, wherein the plurality of through-hole conductors are positioned to be biased to a region close to the side surface, and a maximum displacement region of the active region is deviated from a center of the element body when viewed from the lamination direction.

7. The piezoelectric element according to claim 1, wherein a distance from one main surface of the pair of main surfaces to the active region is smaller than a distance from the side surface of the element body to the active region.

\* \* \* \* \*